US008659344B2

(12) United States Patent
Wagner et al.

(10) Patent No.: US 8,659,344 B2

(45) Date of Patent: Feb. 25, 2014

(54) ELECTRONIC CIRCUIT WITH A REGULATED POWER SUPPLY CIRCUIT

(75) Inventors: Martin Wagner, Norderstedt (DE); Henk Boezen, Nijmegen (NL); Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 337 days.

(21) Appl. No.: 13/144,337

(22) PCT Filed: Jan. 13, 2010

(86) PCT No.: PCT/IB2010/050126

§ 371 (c)(1), (2), (4) Date: Jul. 13, 2011

(87) PCT Pub. No.: WO2010/082160

PCT Pub. Date: Jul. 22, 2010

(65) Prior Publication Data

US 2011/0260782 A1 Oct. 27, 2011

(30) Foreign Application Priority Data

Jan. 16, 2009 (EP) .................................... 09150794

(51) Int. Cl.
*H03K 17/16* (2006.01)

(52) U.S. Cl.
USPC .......................................... 327/387; 323/282

(58) Field of Classification Search
USPC ......... 323/222, 224, 225, 267, 268, 271–276, 323/282–289; 363/16–17, 21.01, 21.13, 363/21.15; 307/31, 36, 39
See application file for complete search history.

(56) References Cited

U.S. PATENT DOCUMENTS 5,539,341 A * 7/1996 Kuo .............................. 327/108
5,781,058 A * 7/1998 Sanzo et al. .................. 327/387

(Continued)

FOREIGN PATENT DOCUMENTS

CN 1848670 A 10/2006
CN 2842514 Y 11/2006
JP 11-136049 A 5/1999

OTHER PUBLICATIONS

International Search Report and Written Opinion for Int'l Application PCT/IB2010/050126 (May 6, 2010).

(Continued)

*Primary Examiner* — Rajnikant Patel

(57) ABSTRACT

A power supply regulator circuit uses a feedback loop to control current through a first output transistor from a power supply input to a regulated power supply output. The first output transistor is included in an integrated circuit. In order to avoid heating of the integrated circuit in excess of an acceptable level due to permanent supply of a high current through the first transistor, current through a second output transistor in parallel with the first transistor, but outside the integrated circuit is raised when it is detected that the current through the first output transistor exceeds a threshold level. The second output transistor outside the integrated circuit serves to take over supply of a part of the power supply current from first output transistor inside integrated circuit, when long term supply of that part from first output transistor would lead to undesirable heating of the integrated circuit. During a limited time interval a first transistor current above the threshold level is acceptable. During this time interval the current through the second output transistor is raised slowly in order to avoid unpredictable stability problems and the generation of excessive power supply noise.

11 Claims, 2 Drawing Sheets

(56) References Cited

U.S. PATENT DOCUMENTS

| | | | | |
|---|---|---|---|---|
| 5,828,205 | A * | 10/1998 | Byrne | 323/268 |
| 6,377,088 | B1 * | 4/2002 | Dumas | 327/112 |
| 6,469,480 | B2 | 10/2002 | Kanakubo | |
| 6,559,623 | B1 | 5/2003 | Pardoen | |
| 6,583,610 | B2 * | 6/2003 | Groom et al. | 323/288 |
| 7,002,328 | B2 * | 2/2006 | Kernahan et al. | 323/283 |
| 7,106,032 | B2 | 9/2006 | Chen et al. | |
| 7,362,179 | B2 | 4/2008 | Liu et al. | |
| 8,295,020 | B2 * | 10/2012 | Oki | 361/87 |
| 2002/0014882 | A1 | 2/2002 | Hsu | |

OTHER PUBLICATIONS

Freescale Semiconductor, "System Basis Chip with High-Speed CAN Transceiver," doc. No. MC33989, Data Sheet, 66 pgs. (Mar. 2007).

Freescale Semiconductor, "System Basis Chip with Enhanced High-Speed CAN Transceiver," doc. No. MC33742, Data Sheet, 70 pgs. (Jun. 2008).

Freescale Semiconductor, "System Basis Chip with Speed Fault Tolerant CAN Interface," doc. No. MC33889, Data Sheet, 60 pgs. (Mar. 2007).

* cited by examiner

Fig.3
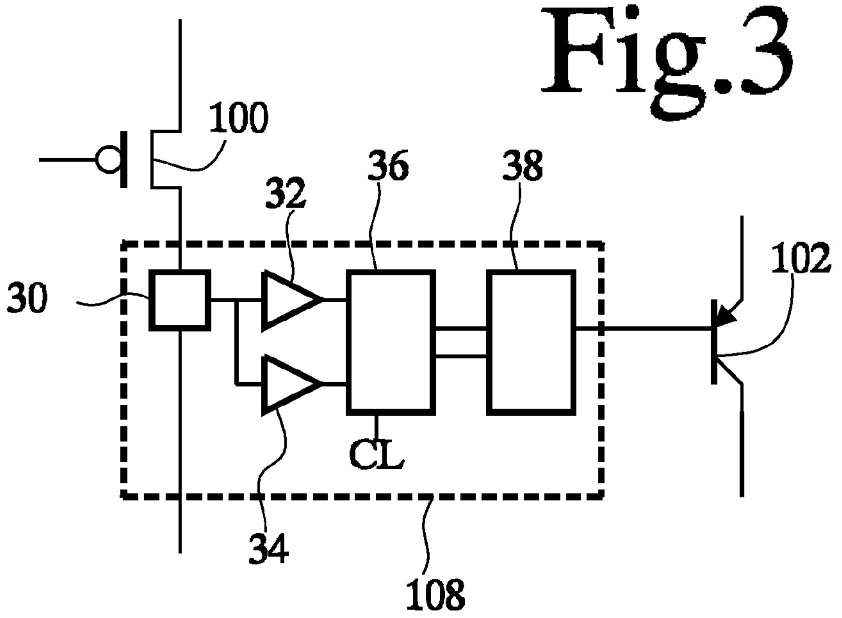
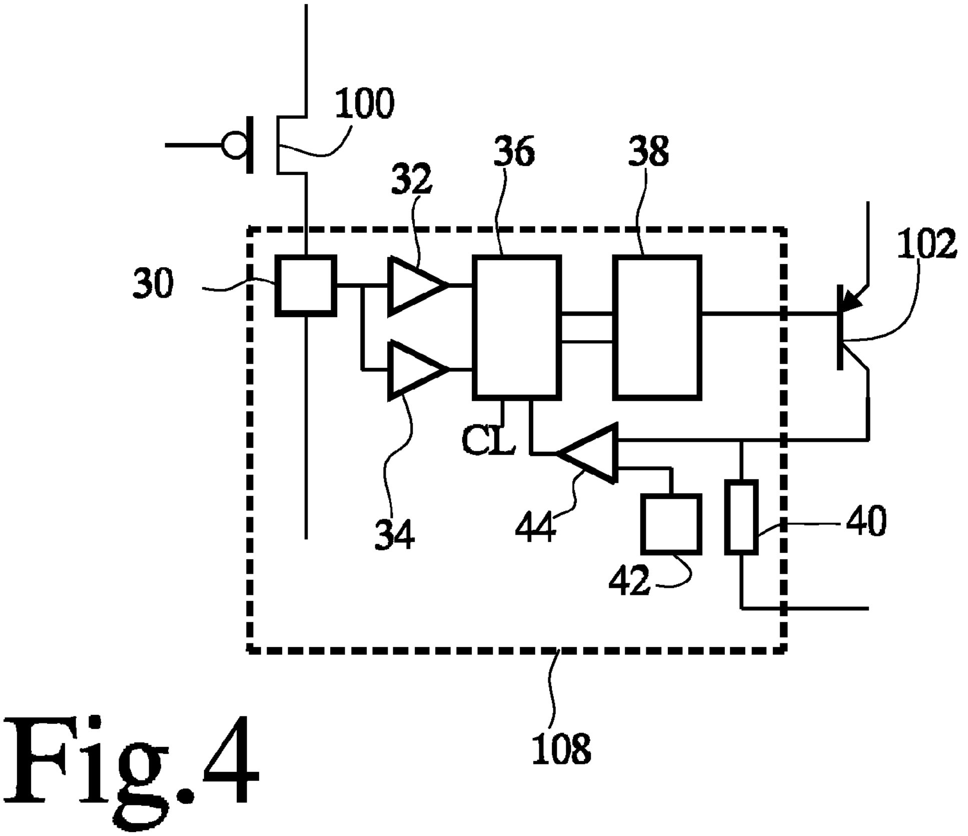
Fig.4

ELECTRONIC CIRCUIT WITH A REGULATED POWER SUPPLY CIRCUIT

FIELD OF THE INVENTION

The invention relates to an electronic circuit with power supply circuit, an integrated circuit for use in such an electronic circuit and to a method of supplying power.

BACKGROUND OF THE INVENTION

U.S. Pat. No. 7,106,032 discloses a regulated power supply circuit with two parallel output transistors: a low power output transistor and a high power output transistor, the high power output transistor being switched on only when a high output current must be supplied. The output transistors are PMOS transistors with their channels coupled in parallel between the positive power supply source and the regulated output of the power supply circuit. The power supply transistors provide for a voltage drop between the positive power supply source and the regulated output. The output voltage at the regulated output is regulated by measuring this output voltage and using the measured output voltage to control the current through the output transistors.

Thus, the output transistors dissipate the power associated with excess supply voltage. In addition the circuits in the feed-back loop that drives the output transistors dissipate power. U.S. Pat. No. 7,106,032 teaches that the latter power dissipation can be reduced by using only the low power output transistor when high power output is not required. As disclosed by U.S. Pat. No. 6,469,480 this type of circuit can also help to prevent overshoots by activating only an output transistor with low driving power in the case of a large difference between the actual output voltage at the regulated output and the desired output voltage. When this difference between the actual and desired output voltage is small, both transistors are activated to provide for a fast response.

Power supply circuits may be integrated together with other circuits, such as processors, communication transmitters and receivers, sensors etc. In this case, heating due to the power dissipation by the regulated power supply circuit may detrimentally affect the operation of such co-integrated circuits.

Such detrimental effects can be avoided, or at least reduced, by using a regulated power supply circuit with output transistors outside the integrated circuit, i.e. by integrating only the control part of the regulated power supply circuit. This makes it possible to provide for some thermal isolation between the integrated circuit and the output transistors. However, this solution introduces a problem of potential instability of the regulated power supply circuit, because the designer of the integrated circuit cannot know the parameters of the output transistors that may be selected by end users and because the wiring between the integrated circuit and the output transistors may introduce additional phase shift in the control loop.

SUMMARY OF THE INVENTION

Among others, it is an object to provide for a regulated power supply circuit wherein stability problems are reduced by at least partly integrating the regulated power supply circuit and wherein heating problems are reduced.

An electronic circuit according to claim 1 is provided. Herein a current from a power supply input to a regulated power supply output through a first output transistor in an integrated circuit is controlled using first driver circuit to realize a controlled output voltage. A current through a second output transistor outside the integrated circuit is raised when an indication of a current through the first output transistor indicates that this current exceeds a threshold level. The second output transistor outside the integrated circuit serves to gradually take over supply of a part of the power supply current from first output transistor inside integrated circuit, when long term supply of that part from first output transistor would lead to undesirable heating of the integrated circuit.

A second driver circuit may be used to monitors an indication of the current supplied by the first output transistor. In an embodiment, the second driver circuit may be included in the integrated circuit. The second driver circuit initiates a rise of the current supplied by the second output transistor at least if the monitored current exceeds a threshold level. The rise lasts at least until the monitored current drops below the threshold level.

In this electronic circuit there is no need to avoid that the first output transistor temporarily supplies more than the threshold current. The first output transistor may be designed to be able to supply such excessive currents, but because it needs to supply such excessive current only temporarily before the second output transistor takes over the current excess, no heating problem arises.

This freedom to suffer temporarily excessive current may be used to eliminate the effect of the unpredictable values of parameters of the second output transistor on the stability of power supply control and/or to reduce power supply noise. This may also make it easier to satisfy EMC requirements (Electro Magnetic Compatibility). Because the second driver circuit initiates a rise of the current supplied by the second output transistor, the variation of current through the second output transistor is not as fast as the current variations through the first output transistor involved in power regulation. A slow response can be used, that masks spread of the parameters of second output transistor.

In an embodiment the second driver circuit may be configured to raise the current through the second output transistor at a predetermined rate, which may be independent of the actual current excess. Thus stability problems are reduced. Alternatively a selected one of a predetermined set of discrete rates may be used with the same effect.

In an embodiment the second driver circuit may initiate a reduction of the current through the second output transistor in response to detection that the indicated current through the first output transistor is below a further threshold level. Thus, the first output transistor can be given back a larger "current budget" to regulate the power supply if current from the second output transistor is no longer needed to prevent heating problems. In an embodiment the further threshold level for initiating a reduction is spaced apart from the threshold level for initiating a rises. This reduces power supply noise.

In an embodiment a pull down transistor may be provided to drain excessive current from the second output transistor temporarily while the current through the second output transistor is reduced. Thus, sufficient "current budget" for regulation can be ensured even before the current through the second output transistor has been lowered.

In an embodiment driver circuit of second output transistor comprises a ramp circuit that ramps up the current through the second output transistor in steps at a predetermined rate upon detection that the indicated current through the first output transistor exceeds the threshold level. This makes it possible to reduce power supply noise. In a further embodiment the driver circuit is configured to ramps down of the current through the second output transistor in steps when the indicated current through the first output transistor is below a further threshold level lower than the threshold level that starts ramp up. In this embodiment, the ramp step size is smaller than a distance between the threshold level and the further threshold level. This reduces power supply noise.

In an embodiment the ramp circuit comprises a digital counter and a digital to analog converter applied to a count value of the counter to control the current from the second output transistor. In this embodiment the driver circuit comprises a comparator configured to compare the indicated current with the threshold level. An output of the comparator enables counting when the indicated current exceeds the threshold level.

BRIEF DESCRIPTION OF THE DRAWINGS

These and other object and advantageous aspects will become apparent from a description of exemplary embodiments using the following Figures:

FIG. 3 shows a second driver circuit

FIG. 4 shows a second driver circuit

DETAILED DESCRIPTION OF THE EMBODIMENTS

Figure 1:
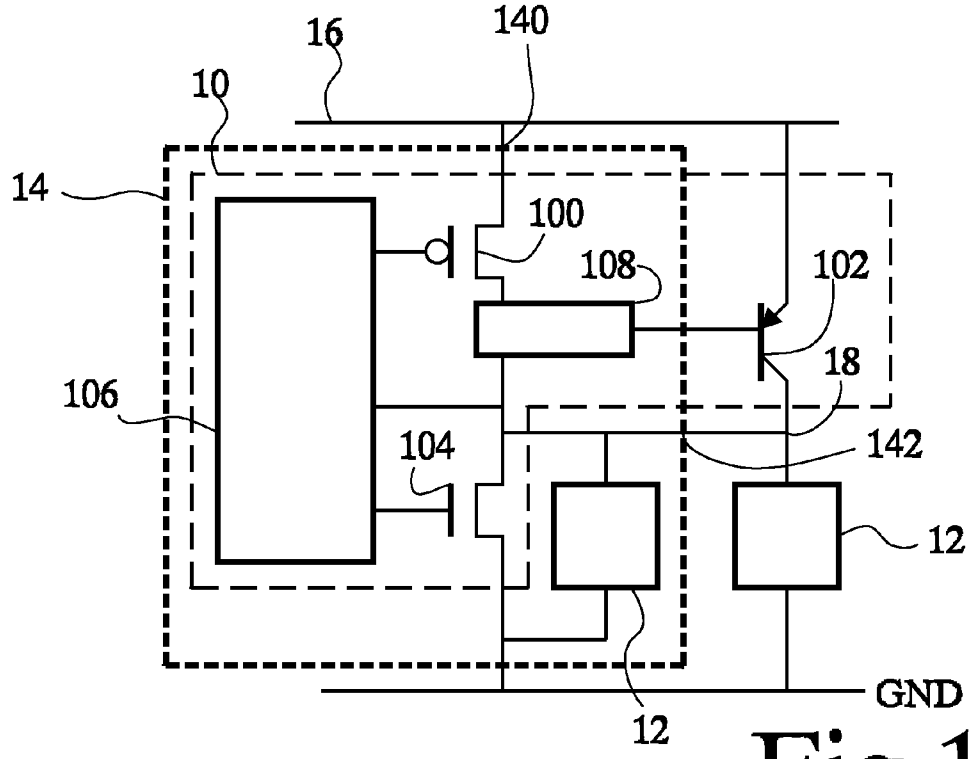
FIG. 1 shows a circuit containing a power supply control circuit

FIG. 1 shows an embodiment of an electronic circuit comprising a power supply control circuit 10 and further circuits 12. The further circuits 12 receive power supply input from power supply control circuit 10. The electronic circuit is partly integrated in an integrated circuit 14. The part of the circuit that is integrated in this integrated circuit 14 is indicated by a dashed box. The electronic circuit has a power supply input 16 and a regulated power supply output 18, coupled to a power supply input terminal 140 and a power supply output terminal 142 of integrated circuit 14.

Power supply control circuit 10 comprises a first output transistor 100, a second output transistor 102, a pull-down transistor 104, a first driver circuit 106 and a second driver circuit 108. First output transistor 100, pull-down transistor 104, first driver circuit 106 and second driver circuit 108 are included in integrated circuit 14. Integrated circuit 14 may comprise a single semi-conductor substrate on which all these components are realized, or a single substrate of any other type with semiconductor layers on that substrate wherein these components are realized. Second output transistor 102 is a separate transistor, outside integrated circuit 14. The further circuits 12 may be included inside and/or outside integrated circuit 14.

By way of example, first output transistor 100 is a PMOS transistor, with a source coupled to power supply input terminal 140 and a drain coupled to power supply output terminal 142. Also by way of example, second output transistor 102 is a bipolar PNP transistor, with an emitter coupled to power supply input terminal 140 and a collector coupled to power supply output terminal 142. For both transistors 100, 102, the main current channel of the transistor 100, 102 (the source-drain channel and the emitter-collector connection) is thus coupled between power supply input terminal 140 and power supply output terminal 142. Pull-down transistor 104 is an NMOS transistor with a source coupled to ground and a drain coupled to power supply output terminal 142. Although a specific example with a mix of bipolar and MOS transistors is shown, it should be appreciated that each of the transistors could be a MOS transistor or a bipolar transistor, or each of the transistors could be one of a plurality of parallel transistors. However, by using MOS transistors for the first output transistor 100 and the pull-down transistor 104 in integrated circuit 14, the implementation of the integrated circuit 14 is simplified. Use of a bipolar device for second (external) output transistor 102 may reduce cost and simplify the construction of the electronic circuit.

First driver circuit 106 has an input coupled to power supply output terminal 142 and outputs coupled to the control electrodes (gates) of first output transistor 100 and pull-down transistor 104. In the embodiment, second driver circuit 108 has a current sensing input side coupled between the drain of first output transistor 100 and power supply output terminal 142 and an output coupled to the control electrode (base) of second output transistor 102.

In operation second output transistor 102 may be used to avoid heating due to long term power dissipation in integrated circuit 14. First driver circuit 106 and first output transistor 100 are used to respond quickly to fluctuations of the load on the power supply output, keeping the output voltage substantially constant irrespective of load current variations, by adapting the current through first output transistor 100. If the necessary current exceeds a level that, if maintained permanently through first output transistor 100, may lead to an undesirable degree of heating of integrated circuit 14, second driver circuit 108 responds by controlling second output transistor 102 to supply a rising current, so that first driver circuit 106 and first output transistor 100 will reduce the current through first output transistor 100 by a corresponding amount, to a current at or below said level. In one example, said level is 80 mA and first driver circuit 106 may drive first output transistor 100 to supply up to 250 mA. In this case second output transistor is used to supply up to at least 170 mA, in order to reduce the current level through first power supply transistor 100 to or below said level.

Preferably, both first and second output transistor 100, 102 are dimensioned to that both are able to supply currents with sizes over the entire range of possible load currents. This is because first output transistor 100 must be able to respond to all load fluctuations at least for a period before second output transistor 102 follows the load fluctuation and second output transistor 102 has to be able to supply a substitute current. Preferably, first driver circuit 106 and first output transistor 100 are configured to supply up to the maximum current that the entire power supply circuit is configured to supply, i.e. the circuit including second output transistor 102 and its second driver circuit.

Thus, the circuit may provide substantially the same maximum driving capacity for first and second output transistor 102. Preferably, the supply capability of second output transistor 102 is at least the supply capability of the entire power supply circuit minus the level that may lead to an undesirable degree of heating of first output transistor 100, if applied permanently. The supply capability of second output transistor 102 need not be much higher than this.

In operation, first driver circuit 106 determines a difference between the actual output voltage at power supply output terminal 142 and a desired output voltage. First driver circuit 106 drives the gate voltage of first output transistor 100 dependent on this difference, with the effect that the current through the main current channel of first output transistor 100 is changed. The current through the main current channel of first output transistor 100 is raised when the actual output voltage is lower than the desired output voltage and lowered when the actual output voltage is higher than the desired output voltage.

In operation second driver circuit 108 controls the current through the main current channel of second output transistor 102. Second driver circuit 108 does so in a way that makes phase delays due to second output transistor 102 immaterial for the stability of the control loop.

Figure 2:
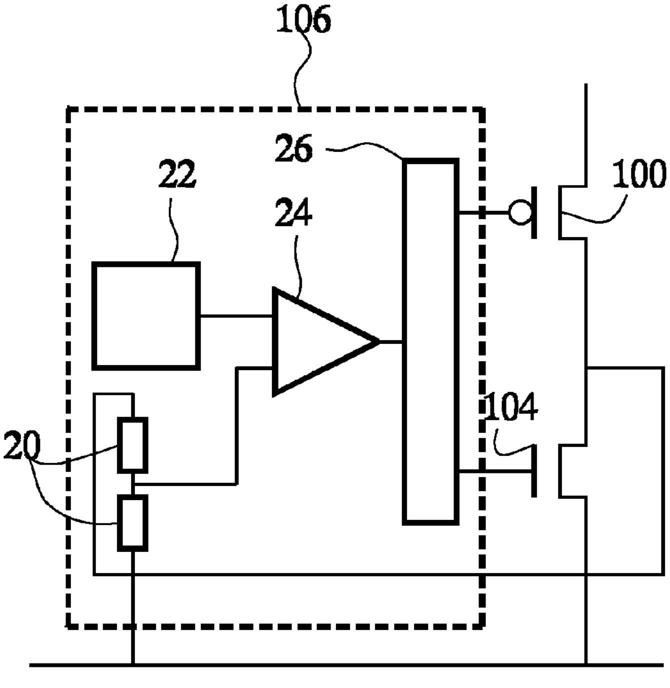
FIG. 2 shows a first driver circuit

FIG. 2 shows an embodiment of first driver circuit 106, comprising a voltage divider 20, a reference source 22, a difference amplifier 24 and a bias circuit 26. Voltage divider 20 has an input coupled to power supply output terminal 142. Difference amplifier 24 has inputs coupled to reference source 22 and an output of voltage divider 20. An output of difference amplifier 24 is coupled to the gates of first output transistor 100 and pull-down transistor 104.

In operation difference amplifier 24 generates a signal proportional to the difference between a divided down version of the voltage of at the power supply output terminal 142 and a reference voltage from reference source 22. First output transistor 100 is made to supply increasing or decreasing current dependent on whether the divided down reference voltage is below or above the reference voltage respectively. Bias circuit 26 passes this signal from difference amplifier to the gates of first output transistor 100 and pull-down transistor 104. Bias circuit 26 makes pull-down transistor 104 conductive if the signal indicates that the divided down reference voltage is above the reference voltage. Class C or AB biasing may be used. In another embodiment bias circuit 26 makes pull-down transistor 104 conductive if the current that must be supplied by first output transistor 100 is below a predetermined “budget level” that allows for up and down variations of the current from first output transistor 100.

FIG. 3 shows an embodiment of second driver circuit 108, comprising a current sense circuit 30, first and second comparators 32, 34, a counter 36 and a digital to analog converter 38. Current sense circuit 30 is included in the connection between the drain of first output transistor 100 and power supply output terminal 142. Current sense circuit 30 has outputs coupled to inputs of first and second comparators 32, 34. Counter 36 has an up count enable input, a down count enable input, a clock input and a count output.

First and second comparators 32, 34 have outputs coupled to the up and down count enable inputs. First comparator 32 is configured to enable up counting, to start increasing the current supplied to the base of second output transistor 102, when the sensed current through first output transistor 100 exceeds a first threshold. Second comparator 34 is configured to enable down counting when the sensed current through first output transistor 100 drops below a second threshold, lower than the first threshold, to start decreasing the current supplied to be base of second output transistor 102. In the case of a MOS-type second output transistor, up and down counting may be selected as needed to increase and decrease the gate-source voltage size when the sensed current through first output transistor 100 is above and below the first and second threshold respectively. The count output of counter 36 is coupled to a digital input of digital to analog converter 38. An analog output of digital to analog converter 38 is coupled to the base of second output transistor 102.

In operation the combination of counter 36 and digital to analog converter 38 act as a ramp circuit that generates a base current that either ramps up at a predetermined rate, ramps down at a predetermined rate or remains constant. First comparator 32 makes the ramp circuit ramp up the base current when the current from first output transistor 100 to power supply output terminal 142 exceeds the first threshold. This has the effect that second output transistor 102 is made to supply more current to the power supply output. In response, first driver circuit 106 reduces the current through first output transistor 100. As a result the current through first output transistor 100 will drop back below the first threshold, so that first comparator 32 deactivates ramp up.

Although an embodiment is shown wherein the ramp-up is stopped when the first output transistor current reaches the threshold level that was used trigger the start of raising the second output transistor current, it should be appreciated that these levels need not be the same. For example, ramp-up is stopped when the first output transistor current reaches a further threshold level at a distance below the level that was used trigger the start of raising the second output transistor current. In this case, a count enable flip-flop may be added to control the enable input of counter 36 for example, the count enable flip-flop being set and reset dependent on comparison of the indication of the first output transistor current with mutually different levels.

The output range of the combination of counter 36 and digital to analog converter 38 is preferably selected to that it allows the current from second output transistor 102 to change from substantially zero to at least a maximum current needed to reduce the current through first output transistor 100 to the acceptable long term level at maximum overall output current. The maximum realized current depends on the beta (current amplification factor)) of second output transistor 200. Thus, if a maximum current of 180 mA must be supplied for example, and the beta is fifty, digital to analog converter 38 needs to realize a maximum base current of 3.6 mA. When the beta is five hundred, digital to analog converter 38 needs to realize a maximum base current of 0.36 mA. In order be independent of the selection of second output transistor 100, digital to analog converter 38 is preferably arranged to realized the maximum base current needed for the smallest possible beta (say fifty), even in circuits wherein a second output transistor 100 with a greater beta is used.

When load fluctuations cause the current from first output transistor 100 to power supply output terminal 142 to drop below the second threshold, second comparator 34 makes the ramp circuit ramp start lowering the base current of second output transistor 102. This has the effect that second output transistor 102 is made to supply less current to the power supply output. In response, first driver circuit 106 increases the current through first output transistor 100. As a result the current through first output transistor 100 will rise back above the second threshold, so that second comparator 32 deactivates ramp down (alternatively, ramp down may be deactivated when the current through first output transistor 100 rises to a further level, e.g. at a distance above the second threshold). In the embodiment wherein second output transistor 102 is a MOS transistor, its gate voltage may be ramped up and down instead of the base current.

It may be noted that the difference between the first and second threshold current ensures that second output transistor 102 is not immediately switched between raising and lowering its output current. This reduces power supply noise. The difference between the thresholds introduces hysteresis: at an instantaneous output current from first output transistor 100 the output current from second output transistor 102 may depend on the history of the output current from first output transistor 100. When the load current fluctuates, second output transistor 102 may give rise to excess supply current. Pull-down transistor 104 serves to drain this excess supply current temporarily, until counter 36 and digital to analog converter 38 have ramp up sufficiently to remove the excessive current from second output transistor 102.

The maximum step size between successive selectable output levels of digital to analog converter 38 is preferably selected so that the resulting current steps from second output transistor 102 are smaller than the distance between the first and second threshold current. This prevents introduction of additional noise. Preferably this step size is selected so that this holds for all possible beta values of output transistor 102. Thus, the relation between the hysteresis and the step size is selected according to the maximum possible beta value, of say five hundred, in contrast to the output range, which is selected according to the minimum possible beta value. Furthermore, the size of steps preferably does not exceed the maximum current level at which undesirable heating occurs in the integrated circuit 14, when applied permanently.

The clock frequency applied to counter 36 is preferably quite low. The clock frequency determines the duration of the time interval before second output transistor 102 will draw sufficient current to reduce the current from first output transistor 100 below the level that may lead to undesirable heating. This defines a lower limit for the clock frequency. Preferably, the clock frequency is selected below the cut off frequency of second output transistor 102, and preferably well below this cut-off frequency. This reduces power supply noise and interference. Preferably, a frequency divider (not shown) is used between an internal clock of integrated circuit 14 and the clock input of counter 36 to realize such a low frequency.

Digital to analog converter 38 preferably is of a design that does not produce glitches and has an input/output relation that increases monotonously increasing input output relation for increasing count values to prevent stability problems. A clocked digital to analog converter 38 may be used. A conversion circuit may be used with a resistive divider circuit with a plurality of taps and a multiplexer used to select a tap dependent on the count value. In an embodiment, digital to analog converter 38 may comprise a controllable current source couple to the base of second output transistor 102 and a control amplifier connected to control the current source dependent on the selected tap. The controllable current source may comprise a transistor in source follower configuration, with a drain coupled to the base of second output transistor 102 and a source coupled to ground via a resistor. In this case the control amplifier may be connected with inputs to the resistor and the multiplexer and an output coupled to the gate of the transistor in source follower configuration to equalize the voltage at the tap and the resistor. When second output transistor 100 is a MOS transistor, a current mirror circuit may be used, wherein second output transistor 100 is the output transistor, digital to analog converter 38 being configured to control the current supplied to the input in substantially equal steps.

FIG. 4 shows a further embodiment of the second driver circuit comprising a resistor 40, a further reference source 42 and a further comparator 44. Resistor 40 is coupled between the collector of second output transistor 102 and the power supply output. In an embodiment resistor 40 may be included in the integrated circuit. In an alternative, resistor 40 is a resistor outside the integrated circuit, which makes it possible to reduce dissipation in the integrated circuit. The inputs of further comparator 44 are coupled to the power supply output via resistor 40 and further reference source 42 respectively and an output of further comparator 44 is coupled to an up count disable input of counter 36.

In operation further comparator 44 serves to prevent overloading of second output transistor 102. Once the collector current of this second output transistor 102 exceeds a threshold, further increases in the base current supplied to the base of second output transistor 102 is disabled.

The step size of successive steps in the current through second output transistor 102 corresponding with one step of counter 36 may have any size. Preferably the range of current corresponding to the maximum number of steps corresponds substantially to the range of currents that can be supplied by the power supply control circuit. Preferably, the size of steps does not exceed the maximum current level at which undesirable heating occurs in the integrated circuit 14, when applied permanently. This maximum current level depends on cooling arrangements of the integrated circuit 14 and on temperature sensitivity of the further circuits in the integrated circuit 14. A large number of steps with a correspondingly lower size may be preferred because it reduces power supply noise. When use is made of hysteresis between raising and lowering the current, the number of steps is preferably chosen to lower output current steps to below the hysteresis. The sizes of different steps need not all be mutually equal.

In another embodiment only one step is used, the second output transistor 102 being switched on and off. In a further embodiment the current through second output transistor 102 may be selected before second output transistor 102 is switched on, dependent on the current through first output transistor 100 at that time. But preferably at least two steps between three different current levels are used. This reduces power supply noise.

Second output transistor 102 outside integrated circuit 14 serves to take over supply of a part of the power supply current from first output transistor 100 inside integrated circuit 14, when long term supply of that part from first output transistor 100 would lead to undesirable heating of the integrated circuit 14. For this purpose second driver circuit 108 monitors an indication of the current supplied by first output transistor 100, and second driver circuit 108 raises the current supplied by second output transistor 102 at least if the monitored current exceeds a threshold.

There is no need to avoid that first output transistor 100 temporarily supplies more than the threshold current. First output transistor 100 is designed to be able to supply such excessive currents, and as long as it supplies such excessive current only temporarily, no heating problem arises. This freedom to suffer temporarily excessive current is used to eliminate the effect of the parameters of second output transistor 102 on the stability of power supply control. As shown in the embodiment, this may be realized by raising the current supplied by second output transistor 102 at a predetermined rate of change, which may be controlled without continuous feedback from second output transistor 102, to improve stability.

Similar stability may be realized if a variably selected rate of change is selected, which is kept constant during at least part of the time while the current through second output transistor 102 is raised. Stability may even be realized with a time continuous feedback from second output transistor 102, with a feedback bandwidth selected to eliminate effects of dynamic parameters of second output transistor 102 on stability. A feedback loop may be used that receives an indication of the current through first output transistor 100 as input and controls the control electrode of second output transistor 102 time continuously dependent on a deviation between the indication of the current and a predetermined value. Such a feedback loop may become inactive when the indication of the current drops below a threshold. Herein the bandwidth of the feedback loop is selected a factor of at least two below the bandwidth of first driver circuit 106, so that the loop gain is below one at frequencies where phase delays due to second output transistor 102 become significant.

It may be noted that the circuit design provides for a family of power supply regulator circuits, with the same integrated circuit design and mutually different second output transistors that may have beta values that vary by as much as a factor ten and preferably at least by a factor two, and that may have different cut-off frequencies, by selecting the range over which the second output transistor current can be adjusted and the steps by which is this done.

Although an embodiment has been shown with a digital implementation of second driver circuit 108, it should be appreciated that an analog circuit may be used instead. For example an integrating circuit may be used, which is supplied with a negative, zero or positive input dependent on the current through first output transistor 100. A capacitor, positive and negative current sources and switches to connect the positive and negative current sources to the capacitor, dependent on the current through first output transistor 100 may be used for example.

Although an embodiment has been shown wherein second driver circuit 108 senses the drain current of first output transistor 100 directly, it should be realized that any indication for the current of first output transistor 100 may be used. Indirect sensing may be used instead. Thus for example, second driver circuit 108 may sense the gate voltage of first output transistor 100, or any other indicative signal in the path from power supply output terminal 142 to first output transistor 100.

Although an embodiment has been shown wherein second driver circuit 108 controls the rate of change of the current from second output transistor 102 between zero and a single rate that is independent of the current through first output transistor or any deviations between the actual and desired output voltage, it should be appreciated that alternatively, the rate of change may be selected dependent on such factors, but with a response speed that is much slower than that of first output transistor 100.

In an embodiment, the rate is selected dependent on the size of the amount by which the indicated current through first output transistor 100 exceeds the threshold. A selection between a limited number of predetermined discrete rates may be made (i.e. a set of rates that are separated by distances between the rates), for example between two or three different positive rates, which may be implemented by using different counter step sizes. One or more additional comparators in parallel with first and second comparator 32, 34 may be used to select the rate, for example by selecting between different step sizes to be used by counter 36.

In one embodiment, a relatively high rate may be selected first when the current through first output transistor is above a further threshold higher than the first threshold and the rate may be lowered to a relatively lower rate once the current drops to between the first threshold and the further threshold. In this embodiment, the current corresponding to the further threshold may be set to exceed the smallest current that leads to undesirable dissipation in the integrated circuit when applied in the long term. Thus the dissipation due to current through first output transistor 100 can be reduced quickly, when there is a large current excess above the further threshold, without yet reaching a level that avoids long term heating problems, followed by a slower reduction of the current until a current is reached that avoids long term heating problems.

Although an embodiment has been shown of an LDO regulator, wherein output transistors 100, 102 have their high impedance terminal coupled to the power supply output, it should be appreciated that similar measures can be taken in other types of regulator. For example, a type of regulator may be used wherein one or both transistors may have their low impedance terminal (emitter, source) coupled to the output, to drive the output voltage. First output transistor 100 may be an NMOS transistor for example, with its source coupled to the power supply output terminal. In this case too, undesirable heating of the integrated circuit can be avoided without additional stability problems by using a second output transistor to take over part of the current supply responsibility form the transistor in the integrated circuit after some time in a way that ensures that stability is not compromised.

Other variations to the disclosed embodiments can be understood and effected by those skilled in the art in practicing the claimed invention, from a study of the drawings, the disclosure, and the appended claims. In the claims, the word “comprising” does not exclude other elements or steps, and the indefinite article “a” or “an” does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An electronic circuit with a power supply regulator circuit that is partly implemented in an integrated circuit, the power supply regulator circuit comprising:

a power supply input;

a regulated power supply output for supplying an output voltage;

a first and a second output transistors with main current channels coupled in parallel between the power supply input and the regulated power supply output, the first output transistor being integrated in the integrated circuit, the second transistor being located outside the integrated circuit;

a first driver circuit coupled between the regulated power supply output and a control electrode of the first output transistor;

a second driver circuit with an input for receiving an indication of a current supplied by the first output transistor and an output coupled to a control electrode of the second output transistor, the second driver circuit being configured to initiate a rise of current through the second output transistor in response to detection that the indicated current through the first output transistor exceeds a threshold level, at least until the indicated current through the first output transistor has dropped below the threshold level.

2. An electronic circuit according to claim 1, wherein the second driver circuit is configured to raise the current through the second output transistor at one of a predetermined rate and at a selected one of a predetermined set of discrete rates, in response to said detection.

3. An electronic circuit according to claim 1, wherein the second driver circuit is configured to initiate a reduction of the current through the second output transistor in response to detection that the indicated current through the first output transistor is below a further threshold level, which is not more than said threshold level.

4. An electronic circuit according to claim 3, wherein a first output transistor current size corresponding to the threshold level exceeds a first output transistor current size indicated by the further threshold level.

5. An electronic circuit according to claim 3, further comprising a power supply reference terminal and a pull down transistor in the integrated circuit, the pull down transistor having a main current channel coupled between the regulated power supply output and the power supply reference terminal, the first driver circuit being coupled to a control electrode of the pull down transistor, the first driver circuit being configured to make the pull down transistor drain current from the second output transistor at least when the current through the second output transistor exceeds an output current needed at regulated power supply output for regulating power supply output.

6. An electronic circuit according to claim 1, wherein the second driver circuit comprises a ramp circuit configured to ramp up the current through the second output transistor in steps at a predetermined rate upon detection that the indicated current through the first output transistor exceeds the threshold level.

7. An electronic circuit according to claim 6, wherein the second driver circuit is configured to initiate a ramp down of the current through the second output transistor in response to detection that the indicated current through the first output transistor is below a further threshold level lower than said threshold level, the ramp circuit being configured to ramp down the current through the second transistor in successive steps with a step size smaller than a distance between the threshold level and the further threshold level.

8. An electronic circuit according to claim 6, wherein the ramp circuit comprises a digital counter and a digital to analog converter coupled between a count output of the digital counter and the control electrode of the second output transistor, wherein the second driver circuit comprises a comparator configured to compare the indicated current with the threshold level, the comparator (32) having an output coupled to an enable input of the counter, to enable counting when the indicated current exceeds the threshold level.

9. An electronic circuit according to claim 1, wherein the first driver circuit and the second driver circuit are included in the integrated circuit.

10. An integrated circuit for use in an electronic circuit with a power supply regulator circuit that is partly implemented in the integrated circuit, the power supply regulator circuit comprising an external output transistor outside the integrated circuit but controlled from the integrated circuit, the integrated circuit comprising:

a power supply input;

a regulated power supply output for supplying an output voltage;

a control output for controlling a control electrode of the external transistor;

a first output transistor with a main current channel coupled between the power supply input and the regulated power supply output;

a first driver circuit coupled between the regulated power supply output and a control electrode of the first output transistor; and a second driver circuit with an input for receiving an indication of a current supplied by the first output transistor and an output coupled to the control output, the second driver circuit being configured to initiate a rise in current through the external transistor in response to detection that the indicated current through the first output transistor exceeds a threshold level, at least until the indicated current through the first output transistor has dropped below the threshold level.

11. A method of regulating power supply output, the method comprising:

controlling a current from a power supply input to a regulated power supply output through a first output transistor in an integrated circuit using a feedback loop to realize a controlled output voltage; and initiating a rise in a current through a second output transistor outside the integrated circuit when an indication of a current through the first output transistor indicates that the current through the first output transistor exceeds a threshold level, at least until the indicated current through the first output transistor has dropped below the threshold level.

* * * * *